United States Patent
Vellaikal et al.

(10) Patent No.: US 7,329,586 B2
(45) Date of Patent: Feb. 12, 2008

(54) GAPFILL USING DEPOSITION-ETCH SEQUENCE

(75) Inventors: Manoj Vellaikal, Santa Clara, CA (US); Hemant P. Mungekar, San Jose, CA (US); Young S. Lee, Santa Clara, CA (US); Yasutoshi Okuno, Kyoto (JP); Hiroshi Yuasa, Kyoto (JP)

(73) Assignees: Applied Materials, Inc., Santa Clara, CA (US); Matsushita Electric Industrial Co., Ltd., Osaka (JP)

(*) Notice: Subject to any disclaimer, the term of this patent is extended or adjusted under 35 U.S.C. 154(b) by 134 days.

(21) Appl. No.: 11/166,357

(22) Filed: Jun. 24, 2005

(65) Prior Publication Data

US 2006/0292894 A1 Dec. 28, 2006

(51) Int. Cl.
H01L 21/76 (2006.01)
(52) U.S. Cl. .............. 438/435; 438/703; 438/723; 438/788
(58) Field of Classification Search .......... 438/703, 438/723, 787–790, 424, 435
See application file for complete search history.

(56) References Cited

U.S. PATENT DOCUMENTS

| | | | |
|---|---|---|---|
| 4,468,413 A | 8/1984 | Bachmann | |
| 4,690,746 A | 9/1987 | McInerney et al. | |
| 4,851,370 A | 7/1989 | Doklan et al. | |
| 4,872,947 A | 10/1989 | Wang et al. | |
| 4,892,753 A | 1/1990 | Wang et al. | |
| 4,894,352 A | 1/1990 | Lane et al. | |
| 4,960,488 A | 10/1990 | Law et al. | |
| 5,000,113 A | 3/1991 | Wang et al. | |

(Continued)

FOREIGN PATENT DOCUMENTS

JP 61-276977 A 12/1986

(Continued)

OTHER PUBLICATIONS

Abraham, Tom, "Reactive Facet Tapering Of Plasma Oxide For Multilevel Interconnect Applications," V-MIC Conference, IEEE, pp. 115-121, Jun. 15-16, 1987.

(Continued)

*Primary Examiner*—Zandra V. Smith
*Assistant Examiner*—Toniae M Thomas
(74) *Attorney, Agent, or Firm*—Townsensd and Townsend and Crew

(57) ABSTRACT

Methods deposit a film on a substrate disposed in a substrate processing chamber. The substrate has a gap formed between adjacent raised surfaces. Flows of first precursor deposition gases are provided to the substrate processing chamber. A first high-density plasma is formed from the flows of first deposition gases to deposit a first portion of the film over the substrate and within the gap with a first deposition process that has simultaneous deposition and sputtering components until after the gap has closed. A sufficient part of the first portion of the film is etched back to reopen the gap. Flows of second precursor deposition gases are provided to the substrate processing chamber. A second high-density plasma is formed from the flows of second precursor deposition gases to deposit a second portion of the film over the substrate and within the reopened gap with a second deposition process that has simultaneous deposition and sputtering components.

19 Claims, 8 Drawing Sheets

U.S. PATENT DOCUMENTS

| | | | |
|---|---|---|---|
| 5,013,691 A | 5/1991 | Lory et al. | |
| 5,089,442 A | 2/1992 | Olmer | |
| 5,156,881 A | 10/1992 | Okano et al. | |
| 5,215,787 A | 6/1993 | Homma | |
| 5,271,972 A | 12/1993 | Kwok et al. | |
| 5,275,977 A | 1/1994 | Otsubo et al. | |
| 5,279,865 A | 1/1994 | Chebi et al. | |
| 5,288,518 A | 2/1994 | Homma | |
| 5,302,233 A | 4/1994 | Kim et al. | |
| 5,314,724 A | 5/1994 | Tsukune et al. | |
| 5,319,247 A | 6/1994 | Matsuura | |
| 5,334,552 A | 8/1994 | Homma | |
| 5,362,526 A | 11/1994 | Wang et al. | |
| 5,385,763 A | 1/1995 | Okano et al. | |
| 5,399,529 A | 3/1995 | Homma | |
| 5,413,967 A | 5/1995 | Matsuda et al. | |
| 5,416,048 A | 5/1995 | Blalock et al. | |
| 5,420,075 A | 5/1995 | Homma et al. | |
| 5,429,995 A | 7/1995 | Nishiyama et al. | |
| 5,468,342 A | 11/1995 | Nulty et al. | |
| 5,474,589 A | 12/1995 | Ohga et al. | |
| 5,563,105 A | 10/1996 | Dobuzinsky et al. | |
| 5,571,576 A | 11/1996 | Qian et al. | |
| 5,599,740 A | 2/1997 | Jang et al. | |
| 5,624,582 A | 4/1997 | Cain | |
| 5,648,175 A | 7/1997 | Russell et al. | |
| 5,661,093 A | 8/1997 | Ravi et al. | |
| 5,679,606 A | 10/1997 | Wang et al. | |
| 5,719,085 A | 2/1998 | Moon et al. | |
| 5,850,105 A | 12/1998 | Dawson et al. | |
| 5,858,876 A | 1/1999 | Chew | |
| 5,872,052 A | 2/1999 | Iyer | |
| 5,872,058 A | 2/1999 | Van Cleemput et al. | |
| 5,913,140 A | 6/1999 | Roche et al. | |
| 5,915,190 A | 6/1999 | Pirkle | |
| 5,923,993 A * | 7/1999 | Sahota | 438/427 |
| 5,937,323 A | 8/1999 | Orczyk et al. | |
| 5,939,831 A | 8/1999 | Fong et al. | |
| 5,944,902 A | 8/1999 | Redeker et al. | |
| 5,953,635 A | 9/1999 | Andideh | |
| 5,968,610 A | 10/1999 | Liu et al. | |
| 5,990,000 A | 11/1999 | Hong et al. | |
| 6,030,881 A | 2/2000 | Papasouliotis et al. | |
| 6,037,018 A | 3/2000 | Jang et al. | |
| 6,039,851 A | 3/2000 | Iyer | |
| 6,059,643 A | 5/2000 | Hu et al. | |
| 6,136,685 A | 10/2000 | Narwankar et al. | |
| 6,167,834 B1 | 1/2001 | Wang et al. | |
| 6,170,428 B1 | 1/2001 | Redeker et al. | |
| 6,182,602 B1 | 2/2001 | Redeker et al. | |
| 6,189,483 B1 | 2/2001 | Ishikawa et al. | |
| 6,191,026 B1 | 2/2001 | Rana et al. | |
| 6,194,038 B1 | 2/2001 | Rossman | |
| 6,197,705 B1 | 3/2001 | Vassiliev | |
| 6,203,863 B1 | 3/2001 | Liu et al. | |
| 6,204,200 B1 | 3/2001 | Shieh et al. | |
| 6,265,269 B1 * | 7/2001 | Chen et al. | 438/270 |
| 6,335,261 B1 * | 1/2002 | Natzle et al. | 438/435 |
| 6,335,288 B1 | 1/2002 | Kwan et al. | |
| 6,395,150 B1 | 5/2002 | Van Cleemput et al. | |
| 6,503,843 B1 | 1/2003 | Xia et al. | |
| 6,596,654 B1 | 7/2003 | Bayman et al. | |
| 6,846,745 B1 * | 1/2005 | Papasouliotis et al. | 438/706 |
| 6,867,086 B1 * | 3/2005 | Chen et al. | 438/219 |
| 7,078,312 B1 * | 7/2006 | Sutanto et al. | 438/424 |
| 7,163,896 B1 * | 1/2007 | Zhu et al. | 438/694 |
| 7,205,240 B2 * | 4/2007 | Karim et al. | 438/694 |
| 2002/0187655 A1 | 12/2002 | Tan | |
| 2003/0207580 A1 * | 11/2003 | Li et al. | 438/700 |
| 2004/0079728 A1 * | 4/2004 | Mungekar et al. | 216/67 |

FOREIGN PATENT DOCUMENTS

| | | |
|---|---|---|
| JP | 2-58836 A | 2/1990 |
| JP | 4-239750 A | 8/1992 |
| JP | 4-341568 A | 11/1992 |
| JP | 7-161703 A | 6/1995 |
| WO | WO 92/20833 A1 | 11/1992 |

OTHER PUBLICATIONS

Chang, Chorng-Ping et al., "Frequency Effects And Properties Of Plasma Deposited Fluorinated Silicon Nitride," J. Vac. Sci. Technol. B., vol. 6, No. 2, pp. 524-532, Mar./Apr. 1988.

Fukada, Takashi et al., "Preparation Of SiOF Films With Low Dielectric Constant By ECR Plasma CVD," DUMIC Conference, ISMIC, pp. 43-49, Feb. 21-22, 1995.

Galiano, M. et al., "Stress-Temperature Behavior Of Oxide Films Used For Intermetal Dielectric Applications," VMIC Conference, ISMIC, pp. 100-106, Jun. 9-10, 1992.

Hayasaka, N. et al., "High-Quality And Low Dielectric Constant $SiO_2$ CVD Using High Density Plasma," Dry Process Symposium, pp. 163-168, 1993.

Laxman, Ravi K., "Low ϵ Dielectrics: CVD Fluorinated Silicon Dioxides," Semiconductor International, pp. 71, 72, 74, May 1995.

Lee, B. et al., "Dielectric Planarization Techniques For Narrow Pitch Multilevel Interconnects," V-MIC Conference, IEEE, pp. 85-92, Jun. 15-16, 1987.

Matsuda, Tetsuo et al., "Dual Frequency Plasma CVD Fluorosilicate Glass Deposition For 0.25 μm Interlevel Dielectrics," DUMIC Conference, ISMIC, pp. 22-28, Feb. 21-22, 1995.

Meeks, Ellen et al., "Modeling Of $SiO_2$ Deposition in High Density Plasma Reactors And Comparisons Of Model Predictions With Experimental Measurements," J. Vac. Sci. Technol. A, vol. 16, No. 2, pp. 544-563, Mar./Apr. 1998.

Musaka, Katsuyuki et al., "Single Step Gap Filling Technology For Subhalf Micron Metal Spacings On Plasma Enhanced $TEOS/O_2$ Chemical Vapor Deposition System," Extended Abstracts of the International Conference on Solid State Devices And Materials, pp. 510-512, 1993.

Qian, L. Q. et al., "High Density Plasma Deposition And Deep Submicron Gap Fill With Low Dielectric Constant SiOF Films," DUMIC Conference, ISMIC, pp. 50-56, 1995.

Robles, S. et al., "Effects Of RF Frequency And Deposition Rates On The Moisture Resistance Of PECVD TEOS-Based Oxide Films," ECS Extended Abstracts, vol. 92, No. 1, pp. 215-216, May 1992.

Shapiro, M. J. et al., "Dual Frequency Plasma CVD Fluorosilicate Glass Water Absorption And Stability," DUMIC Conference, ISMIC, pp. 118-123, Feb. 21-22, 1995.

Usami, Takashi et al., "Low Dielectric Constant Interlayer Using Fluorine-Doped Silicon Oxide," Jpn. J. Appl. Phys., vol. 33, Part 1, No. 1B, pp. 408-412, Jan. 1994.

Vassiliev, V. Y. et al., "Trends In Void-Free Pre-Metal CVD Dielectrics," Solid State Technology, pp. 129-130, 132, 134, 136, Mar. 2001.

Yu, D. et al., "Step Coverage Study Of Peteos Deposition For Intermetal Dielectric Applications," VMIC Conference, IEEE, pp. 166-172, Jun. 12-13, 1990.

* cited by examiner

GAPFILL USING DEPOSITION-ETCH SEQUENCE

BACKGROUND OF THE INVENTION

One of the persistent challenges faced in the development of semiconductor technology is the desire to increase the density of circuit elements and interconnections on substrates without introducing spurious interactions between them. Unwanted interactions are typically prevented by providing gaps or trenches that are filled with electrically insulative material to isolate the elements both physically and electrically. As circuit densities increase, however, the widths of these gaps decrease, increasing their aspect ratios and making it progressively more difficult to fill the gaps without leaving voids. The formation of voids when the gap is not filled completely is undesirable because they may adversely affect operation of the completed device, such as by trapping impurities within the insulative material.

Common techniques that are used in such gapfill applications include chemical-vapor deposition ("CVD") techniques. Conventional thermal CVD processes supply reactive gases to the substrate surface where heat-induced chemical reactions take place to produce a desired film. Plasma-enhanced CVD ("PECVD") techniques promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes when compared with conventional thermal CVD processes. These advantages may be further exploited by high-density-plasma ("HDP") CVD techniques, in which a dense plasma is formed at low vacuum pressures so that the plasma species are even more reactive. While each of these techniques falls broadly under the umbrella of "CVD techniques," each of them has characteristic properties that make them more or less suitable for certain specific applications.

In some instances where gaps have a large aspect ratio and narrow width, gaps have been filled with thermal CVD techniques using a "dep/etch/dep" process by sequentially depositing material, etching some of it back, and depositing additional material. The etching step acts to reshape the partially filled gap, opening it so that more material can be deposited before it closes up and leaves an interior gap. Such dep/etch/dep processes have also been used with PECVD techniques, but some thermal and PECVD techniques are still unable to fill gaps having very large aspect ratios even by cycling deposition and etching steps.

Cycling of deposition and etching steps was traditionally view by those of skill in the art as inutile in the context of HDP-CVD processes. This view resulted from the fact that, very much unlike PECVD processes, the high density of ionic species in the plasma during HDP-CVD processes causes there to be sputtering of a film even while it is being deposited. This simultaneous sputtering and deposition of material during a deposition process tends to keep the gap open during deposition, and was therefore believed to render a separate intermediate etching superfluous. This prevailing view proved to be partially correct in that higher-aspect-ratio gaps could be filled using an HDP-CVD process than could be filled even with a PECVD dep/etch/dep process. Nevertheless, in U.S. Pat. No. 6,194,038, filed Mar. 20, 1998 by Kent Rossman, the unexpected result was demonstrated that gapfill could be improved even further by using a dep/etch/dep process under certain HDP-CVD process conditions. This result was later confirmed in U.S. Pat. No. 6,030,881, filed May 5, 1998 by George D. Papasouliotis et al.

It turns out that even with the combined deposition and sputtering of HDP-CVD processes, the gap still tends to close when narrow-width high-aspect-ratio structures are filled. The use dep/etch/dep techniques in HDP processes have thus followed the traditional path of dep/etch/dep techniques by depositing sufficient material to partially fill the gap, followed by etching to reshape the gap for further deposition. The steady reduction in feature sizes is currently reaching the stage where the utility of such techniques is approaching its limit. This is particularly true for certain structure geometries, such as shallow-trench-isolation ("STI") structures, that may have both narrow gaps and open regions. As the gap has become more aggressive, increasing number of cycles have been found to be necessary to fill the gaps, with the consequence that each deposition step fills less of the gap by depositing a smaller amount of material. A correspondingly small amount of material is thus deposited in open regions, with the result that the subsequent etching step tends to remove too much of the thin layer of material in the open regions, damaging the underlying structure.

There is accordingly a remaining need in the art to improve HDP-CVD dep/etch/dep processes to accommodate narrow high-aspect-ratio structures.

BRIEF SUMMARY OF THE INVENTION

Embodiments of the invention thus provide gapfill methods that use an interleaved sequence of deposition and etching steps, with an initial deposition step closing the gap before the etching is applied to etch back the deposited material and reopen the gap. In a first set of embodiments, a method is thus provided for depositing a film on a substrate disposed in a substrate processing chamber. The substrate has a gap formed between adjacent raised surfaces. Flows of first precursor deposition gases are provided to the substrate processing chamber. A first high-density plasma is formed from the flows of first deposition gases to deposit a first portion of the film over the substrate and within the gap with a first deposition process that has simultaneous deposition and sputtering components until after the gap has closed. A sufficient part of the first portion of the film is etched back to reopen the gap. Flows of second precursor deposition gases are provided to the substrate processing chamber. A second high-density plasma is formed from the flows of second precursor deposition gases to deposit a second portion of the film over the substrate and within the reopened gap with a second deposition process that has simultaneous deposition and sputtering components.

In some embodiments, the sufficient part of the first portion of the film is etched back by forming a third high-density plasma in the processing chamber from a flow of an etchant gas corrosive to the film. An electrical bias may additionally be applied to the substrate. For example, the first and second precursor deposition gases may each comprise a silicon-containing gas and an oxygen-containing gas so that the film comprises a silicon oxide film; in such instances, the etchant gas may comprise a halogen-containing gas such as a fluorine-containing gas. The first and second precursor deposition gases may further comprise dopant-containing gas in some embodiments. In addition, the first and second precursor gases may comprise molecular hydrogen $H_2$, which may be provided to the process chamber with a flow rate that exceeds 500 sccm.

In some embodiments, the first portion of the film is deposited over the substrate and within the gap with a thickness that exceeds a critical thickness for closing the gap by more than 5% of the critical thickness. In other embodiments, the first portion of the film is deposited over the substrate and within the gap with a thickness that exceeds a critical thickness for closing the gap by more than 10% of the critical thickness. In particular embodiments, the gap has an aspect ratio of at least 5:1 and a width less than 100 nm, or has an aspect ratio of at least 6:1 and a width less than 65 nm. The gap may also comprise a plurality of gaps formed between adjacent raised surfaces, with a first of the gaps having a width at least five times a width of a second of the gaps.

The second portion of the film may be deposited over the substrate and within the reopened gap until the gap has closed again. In such embodiments, a sufficient part of the second portion of the film may be etched back to reopen the gap again. Flows of third precursor deposition gases are provided to the substrate processing chamber. A third high-density plasma is formed from the flows of the third precursor deposition gases to deposit a third portion of the film over the substrate and within the reopened gap with a third deposition process that has simultaneous deposition and sputtering components.

In a second set of embodiments, a method is provided for depositing a silicon oxide film on a substrate disposed in a substrate processing chamber. The substrate has a plurality of gaps distributed in open and dense areas over the substrate. At least one gap in the dense area has an aspect ratio greater than 5:1 and a width less than 100 nm. At least one gap in the open area has a width at least five times the width of the at least one gap in the dense area. First flows of $SiH_4$, $O_2$, and a first fluent gas are provided to the substrate processing chamber. A first high-density plasma is formed from the first flows of $SiH_4$, $O_2$, and the first fluent gas to deposit a first portion of the silicon oxide film over the substrate and within the gaps with a first deposition process that has simultaneous deposition and sputtering components until after the at least one gap in the dense area has closed. A first flow of a fluorine-containing gas is provided to the substrate processing chamber. A second high-density plasma is formed from the first flow of the fluorine-containing gas to etch back a sufficient part of the first portion of the silicon oxide film to reopen the gap. A bias is applied to the substrate while the first portion of the silicon oxide film is being etched back. Second flows of $SiH_4$, $O_2$, and a second fluent gas are provided to the substrate processing chamber. A third high-density plasma is formed from the second flows of $SiH_4$, $O_2$, and the second fluent gas to deposit a second portion of the silicon oxide film over the substrate and within the reopened gap with a second deposition process that has simultaneous deposition and sputtering components.

In some such embodiments, the first and second fluent gases each comprise molecular hydrogen $H_2$ provided to the substrate processing chamber at a flow rate that exceeds 500 sccm. In different embodiments, the first portion of the silicon oxide film is deposited over the substrate and within the gap with a thickness that exceeds a critical thickness for closing the gap by more than 5% of the critical thickness or by more than 10% of the critical thickness.

The second portion of the film may be deposited over the substrate and within the reopened gap until the gap has closed again. In such embodiments, a second flow of a fluorine-containing gas is provided to the substrate processing chamber. A fourth high-density plasma is formed from the second flow of the fluorine-containing gas to etch back a sufficient part of the second portion of the silicon oxide film to reopen the gap again. Third flows of $SiH_4$, $O_2$, and a third fluent gas are provided to the substrate processing chamber. A fifth high-density plasma is formed from the third flows of $SiH_4$, $O_2$, and the third fluent gas to deposit a third portion of the silicon oxide film over the substrate and within the reopened gap with a third deposition process that has simultaneous deposition and sputtering components.

A further understanding of the nature and advantages of the present invention may be realized by reference to the remaining portions of the specification and the drawings.

DETAILED DESCRIPTION OF THE INVENTION

1. Introduction

Embodiments of the invention are directed to methods and apparatus for depositing a film in a gap within a surface of a substrate. The description provided below tends to focus on deposition of a silicon oxide film, which has wide application in the art, but the invention is not limited to any particular film composition, as will be evident from the following discussion. Films deposited according to the techniques of the invention have excellent gapfill capabilities and are able to fill high-aspect-ratio gaps encountered in, for example, STI structures. Films deposited by the methods of the invention are suitable for use in the fabrication of a variety of integrated circuits, and are particularly useful in filling gaps in 100-nm technology (0.100 μm) or smaller, such as 65-nm (0.065 μm) technology or smaller.

Figure 1A:
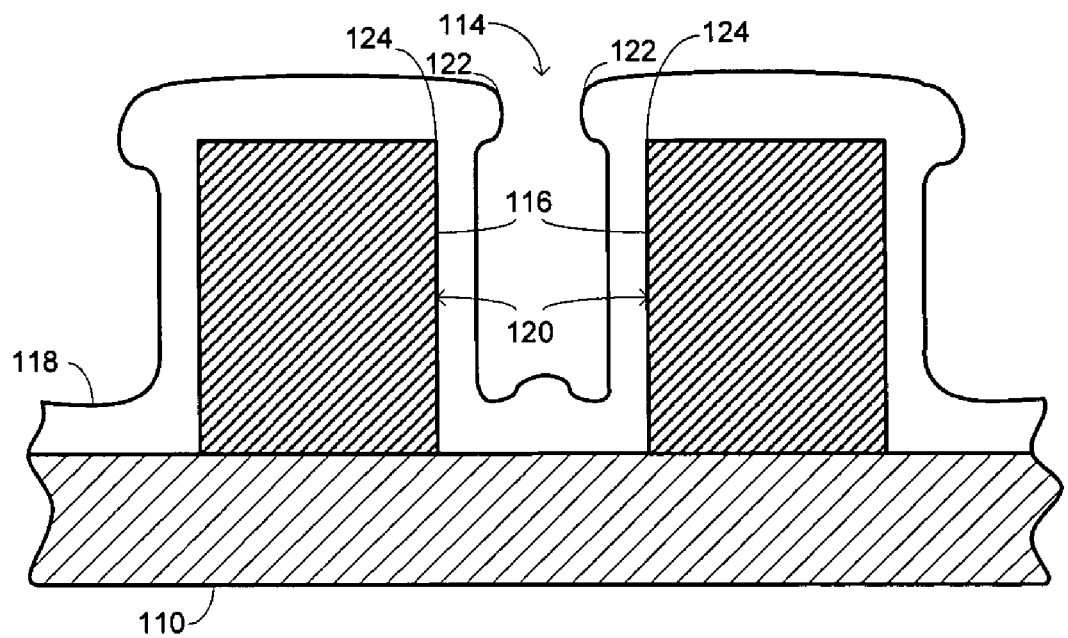
FIGS. 1A and 1B are schematic cross-sectional drawings illustrating the formation of a void during a gapfill process.
Figure 1B:
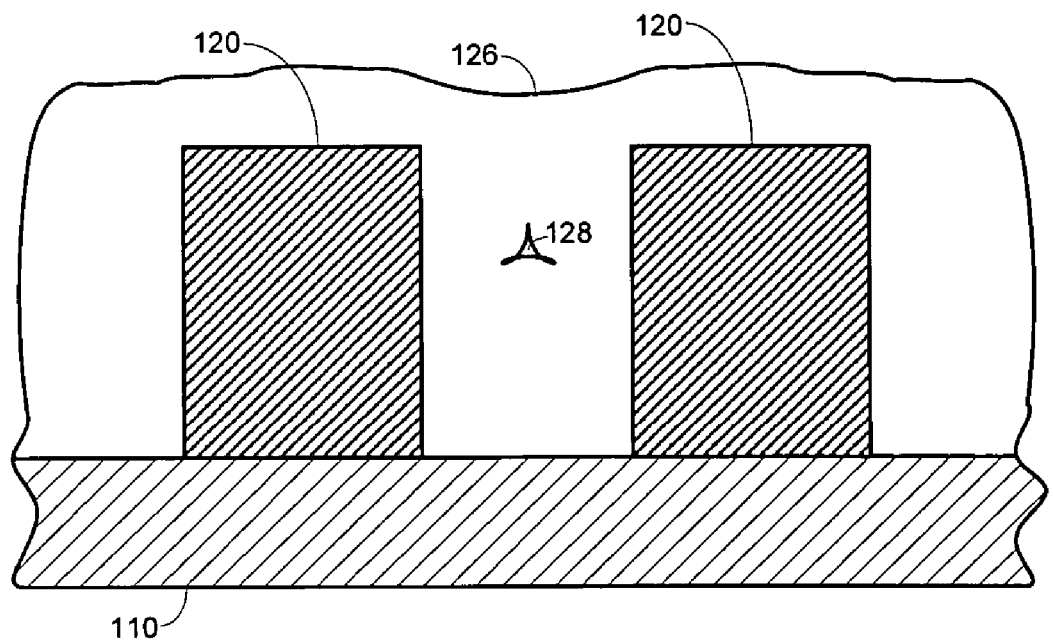

The gapfill problem addressed by embodiments of the invention is illustrated schematically with the cross-sectional views shown in FIGS. 1A and 1B. FIG. 1A shows a vertical cross section of a substrate 110, such as may be provided with a semiconductor wafer, having a layer of features 120. Adjacent features define gaps 114 that are to be filled with dielectric material 118, with the sidewalls 116 of the gaps being defined by the surfaces of the features 120. As the deposition proceeds, dielectric material 118 accumulates on the surfaces of the features 120, as well as on the substrate 110 and forms overhangs 122 at the corners 124 of the features 120. As deposition of the dielectric material 118 continues, the overhangs 122 typically grow faster than the gap 114 in a characteristic breadloafing fashion. Eventually, the overhangs 122 grow together to form the dielectric layer 126 shown in FIG. 1B, preventing deposition into an interior void 128.

Figure 2:
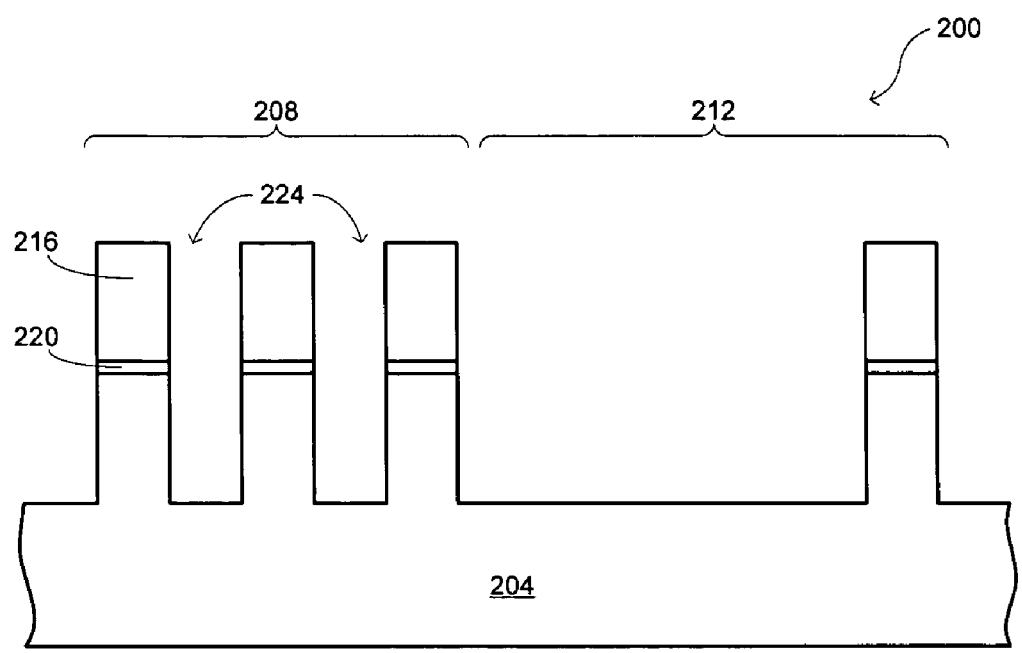
FIG. 2 is a simplified cross-sectional view of a partially completed integrated circuit that includes a plurality of shallow-trench-isolation structures.

The types of structures that may be filled according to embodiments of the invention without such an interior void are illustrated by FIG. 2, which provides a simplified cross-sectional view of a partially completed integrated circuit 200. This integrated circuit is formed over a substrate 204 that includes a plurality of STI structures, each of which is typically created by forming a thin pad oxide layer 220 over the surface of the substrate 204 and then forming a silicon nitride layer 216 over the pad oxide layer 220. The nitride and oxide layers are then patterned using standard photolithography techniques and trenches 224 are etched through the nitride/oxide stack into the substrate 204. FIG. 2 shows that the integrated circuit may comprise areas 208 that are relatively densely packed with transistors or other active devices, and may comprise open areas 212 that are relatively isolated. Active devices in the open areas 212 may be separated from each other by more than an order of magnitude than separations in the densely packed areas 208, but as used herein "open areas" are considered to be areas in which gaps have a width at least five times a width of a gap in a "dense area."

Embodiments of the invention provide methods for filling the trenches 224 with an electrically insulating material such as silicon dioxide using a deposition process that has good gapfill properties. The gapfill characteristics provided by the methods described below advantageously have good gapfill capabilities in both the open and dense areas, making such techniques especially valuable for certain applications. In some instances, prior to the gapfill process, an initial lining layer is deposited over the substrate as an in situ steam generation ("ISSG") or other thermal oxide layer, or perhaps a silicon nitride layer. One benefit to depositing such a liner prior to filling the trenches 224 is to provide appropriate corner rounding, which may aid in avoiding such effects as early gate breakdown in transistors that are formed. In addition, such a liner may aid in relieving stress after the CVD deposition.

As used herein, a high-density-plasma process is a plasma CVD process that includes simultaneous deposition and sputtering components and that employs a plasma having an ion density on the order of $10^{11}$ ions/cm$^3$ or greater. The relative levels of the combined deposition and sputtering characteristics of the high-density plasma may depend on such factors as the flow rates used to provide the gaseous mixture, the source power levels applied to maintain the plasma, the bias power applied to the substrate, and the like. The combination of such factors may conveniently be quantified with a "deposition/sputter ratio," sometimes denoted D/S to characterize the process:

$$\frac{D}{S} \equiv \frac{\text{(net deposition rate)} + \text{(blanket sputtering rate)}}{\text{(blanket sputtering rate)}}.$$

The deposition/sputter ratio increases with increased deposition and decreases with increased sputtering. As used in the definition of D/S, the "net deposition rate" refers to the deposition rate that is measured when deposition and sputtering are occurring simultaneously. The "blanket sputter rate" is the sputter rate measured when the process recipe is run without deposition gases; the pressure within the process chamber is adjusted to the pressure during deposition and the sputter rate measured on a blanket thermal oxide.

Other equivalent measures may be used to quantify the relative deposition and sputtering contributions of the HDP process, as is known to those of skill in the art. A common alternative ratio is the "etching/deposition ratio,"

$$\frac{E}{D} \equiv \frac{\text{(source-only deposition rate)} - \text{(net deposition rate)}}{\text{(source-only deposition rate)}},$$

which increases with increased sputtering and decreases with increased deposition. As used in the definition of E/D, the "net deposition rate" again refers to the deposition rate measured when deposition and sputtering are occurring simultaneously. The "source-only deposition rate," however, refers to the deposition rate that is measured when the process recipe is run with no sputtering. Embodiments of the invention are described herein in terms of D/S ratios. While D/S and E/D are not precise reciprocals, they are inversely related and conversion between them will be understood to those of skill in the art.

The desired D/S ratios for a given step in the HDP-CVD processes are generally achieved by including flows of precursor gases and, in some instances, flows of a fluent gas, which may also act as a sputtering agent. The elements comprised by the precursor gases react to form the film with the desired composition. For example, to deposit a silicon oxide film, the precursor gases may include a silicon-containing gas, such as silane $SiH_4$, and an oxidizing gas reactant such as molecular oxygen $O_2$. Dopants may be added to the film by including a precursor gas with the desired dopant, such as by including a flow of $SiF_4$ to fluorinate the film, including a flow of $PH_3$ to phosphorate the film, including a flow of $B_2H_6$ to boronate the film, including a flow of $N_2$ to nitrogenate the film, and the like. The fluent gas may be provided with a flow of $H_2$ or with a flow of an inert gas, including a flow of He, or even a flow a heavier inert gas, such as Ne, Ar, or Xe. The level of sputtering provided by the different fluent gases is inversely related to their atomic mass (or molecular mass in the case of $H_2$), with $H_2$ producing even less sputtering than He. Flows may sometimes be provided of multiple gases, such as by providing both a flow of $H_2$ and a flow of He, which mix in the HDP-CVD process chamber. Alternatively, the gas may sometimes be premixed so that a flow of $H_2$/He is provided in a mixed state to the process chamber. It is also possible to provide separate flows of higher-mass gases, or to include higher-mass gases in the premixture.

In high-aspect-ratio structures, the use of relatively high flow rates of low-mass fluent gases has been found generally to improve gapfill capability when compared with the more traditional use of fluent gases such as Ar. This is believed to be a consequence of the reduction in redeposition that is achieved by using He or $H_2$ as a fluent gas so that closure of the gap occurs less quickly. One challenge that is faced in structures having both dense and open areas, however, is that the deposition characteristics in the different regions differ. This may be understood with reference to FIGS. 3A and 3B, which show the effect of the sputtering component of an HDP process respectively for a gap in a densely packed area and for a gap in an open area.

Figure 3A:
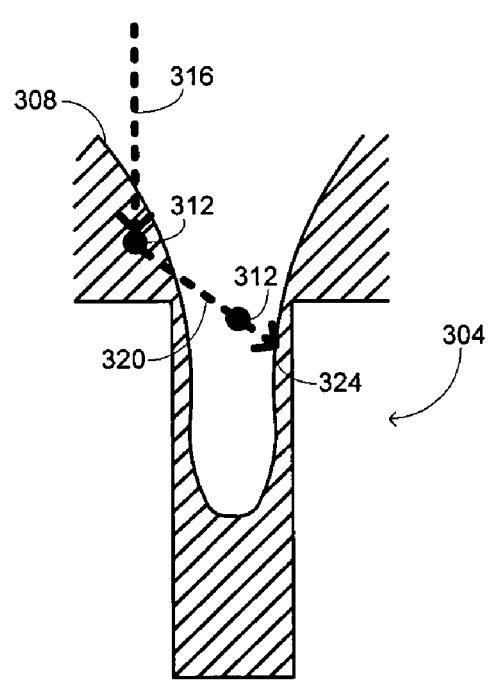
FIGS. 3A and 3B are schematic diagrams that respectively illustrated gapfill characteristics of densely packed areas and open areas in a structure.

In particular, the gap 304 in FIG. 3A is a high-aspect-ratio gap, with the material deposited using an HDP-CVD process forming a characteristic cusp structure 308 over the horizontal surfaces. Redeposition occurs as material 312 is sputtered from the cusp 308 in response to the impact of plasma ions along path 316. The sputtered material 312 follows a path 320 that encounters the sidewall 324 on the opposite side of the gap 304. This effect is symmetrical so that as material is sputtered away from the left side of the gap onto the right side, material is also sputtered away from the right side of the gap onto the left side. The redeposition of material protects against excess sputtering resulting in clipping of the corners.

Figure 3B:
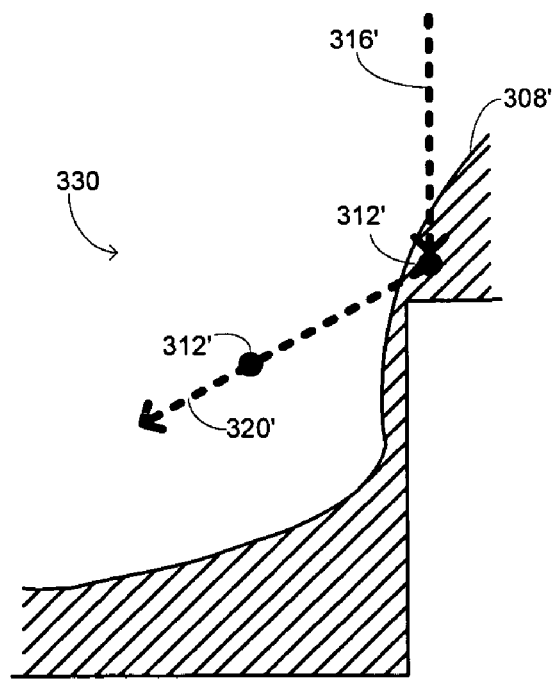

This symmetry is not present in the open areas, as illustrated with the open-area structure 330 shown in FIG. 3B. In this instance, the deposition causes the formation of a similar cusp 308', but when material 312', is sputtered along path 320', in response to the impact of plasma ions along path 316', the opposite side of the gap is too far away for the redeposition to be protective. The corner of the structure in FIG. 3B suffers the same ejection of material as does the corner of the structure in FIG. 3A, without the compensating effect of receiving material sputtered from the opposite side of the gap. One consequence of this difference is manifested when relatively thin films are deposited to accommodate the narrowness of the gap: while sufficient protective material may be present within the gaps of the dense areas, the open areas may have insufficient protective material when exposed to the corrosive chemistry provided during the etching step.

2. Dep/Etch/Dep Processes

Embodiments of the invention operate in a process space where an initial deposition of a dep/etch/dep process deposits a film having a thickness that exceeds a critical thickness for closing the gap. A consequence of this is that an intermediate void may be formed within the deposited material, but this void is exposed by a subsequent etching step and eventually filled by the next or a later deposition step in the deposition/etching cycling. While deposition to a thickness that exceeds the critical thickness for a given gap has traditionally been viewed in the prior art as undesirable because of the formation of the void, the inventors have found that the availability of a larger process space resulting from the techniques described herein is sufficiently advantageous to offset the need to deal with the void.

Figure 4A:
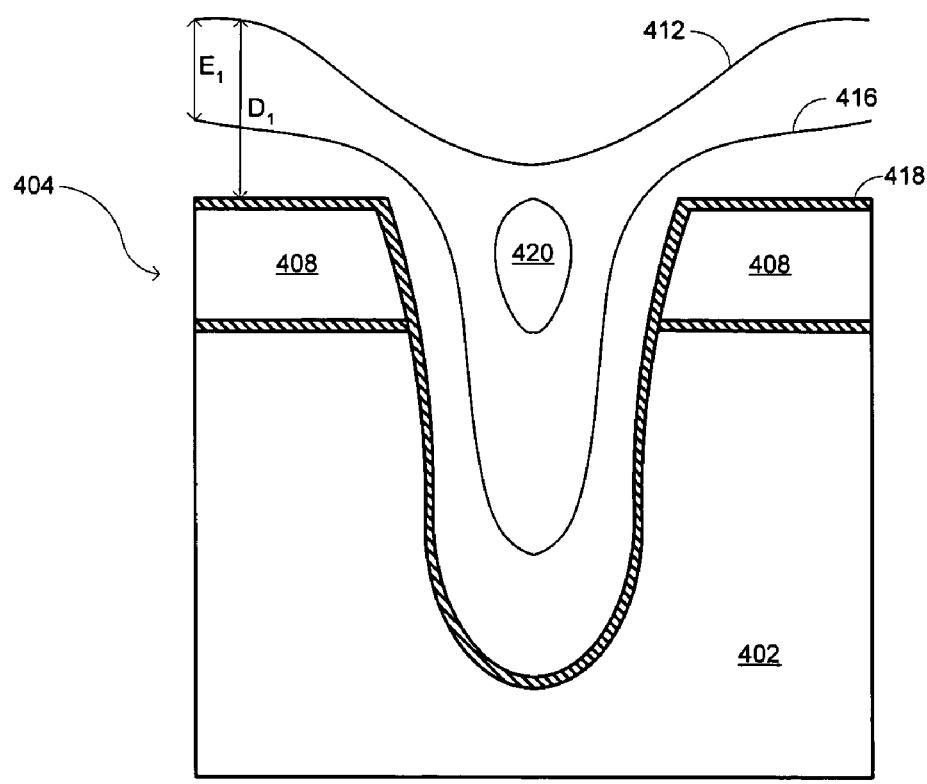
FIGS. 4A and 4B illustrate definitions of parameters that characterize dep/etch/dep process spaces.
Figure 4B:
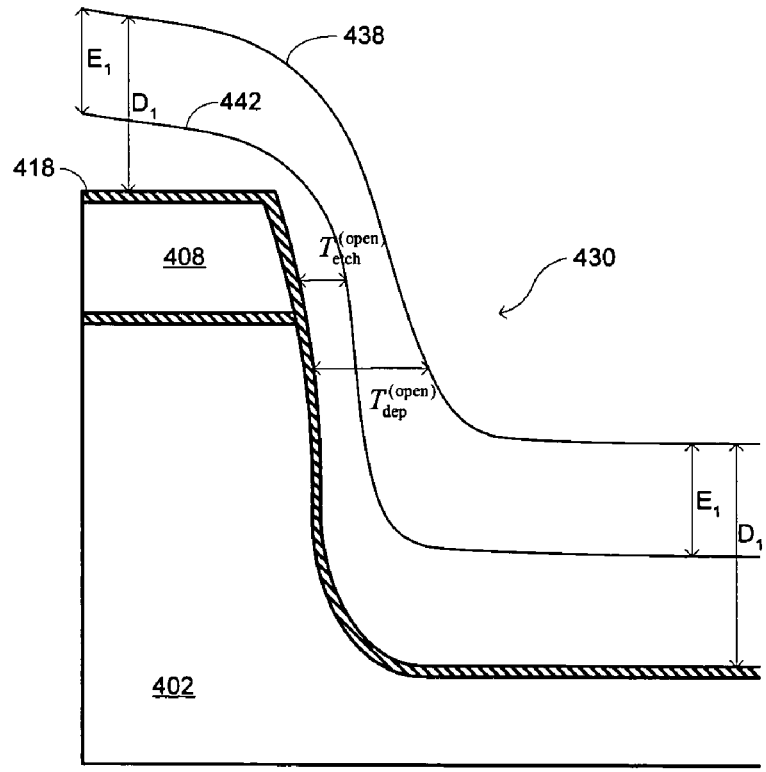

Descriptions of the dep/etch/dep techniques below, and of the resulting process spaces, are made in terms of parameters defined with reference to FIGS. 4A and 4B, which respectively provide cross-sectional views of gaps in dense and open areas of an STI structure. The STI structure 404 includes a substrate 402 having liner 418 and pad layers 408 with gaps defined in both dense and open areas between adjacent raised surfaces. As seen in FIG. 4A, material that is initially deposited over the substrate and within the gaps results in a film profile 412 that is characterized by a deposition thickness $D_1$. Since the thickness of the deposited layer might not be uniform, the deposition thickness $D_1$ used to characterize the deposition may be a thickness at a particular location, such as directly above one of the adjacent raised features, or may be a derived quantity such as a mean thickness. Because this deposition thickness is greater than the critical deposition thickness $D_c$, an intermediate void 420 may be formed within the deposited film. The amount by which the deposition thickness $D_1$ exceeds the critical deposition thickness $D_c$ may vary in different embodiments, with it exceeding the critical deposition thickness $D_c$ by 5%, by 10%, by 20%, by 50%, or by 100% in different embodiments.

The intermediate void 420 is exposed as a result of the subsequent etching step, as evident by the profile of the deposited layer 416 after such etching. The etching may be characterized by the thickness of material removed during etching $E_1$. Similar to the characterization of deposition, the thickness of material removed may be nonuniform so that $E_1$ may be a thickness removed at a particular location, such as directly above one of the adjacent raised features, or may be a derived quantity such as a mean thickness.

The quantities $D_1$ and $E_1$ are both measured in a substantially vertical direction above the substrate. In some instances, particularly in the open areas, deposition and etching thickness may also be defined in other directions. One convenient measure is a horizontal measure, as exemplified in FIG. 4B by $T_{dep}^{(open)}$ and $T_{etch}^{(open)}$. The material deposited over the substrate within the open area 430 may be characterized by the vertical thickness $D_1$ of material deposited and/or by the horizontal thickness $T_{dep}^{(open)}$ that the deposition profile 438 has extending into the open area from one of the raised surfaces. Similarly, the amount of etching that takes place within the open area 430 may be characterized by the vertical thickness $E_1$ of material removed in producing profile 442, or by the horizontal thickness $T_{etch}^{(open)}$ of material removed according to that profile 442 from within the open area. Again, the profiles 438 and 442 of the material after deposition and after etching may be nonuniform. The parameters $T_{dep}^{(open)}$ and $T_{etch}^{(open)}$ may accordingly be determined at specific locations such as where the substrate 402 meets the pad layer 408 or may be derived quantities such as mean values. In the drawing, these parameters are determined where the substrate 402 meets the pad layer 408, the separation shown in the drawing existing merely to accommodate the constraints of the drawing.

Merely by way of example, a 70-nm-wide, 500-nm-deep gap (i.e. having an aspect ratio of about 7:1) closes at about 60% of the total trench height for a D/S ratio of about 30. The critical deposition thickness $D_c$ in such an example is thus about 3000 Å and a suitable initial deposition amount $D_1$ may be about 3200 Å in a particular embodiment. A suitable etch-back amount $E_1$ may be about 500 Å to reopen the gap in a particular embodiment.

Figure 5:
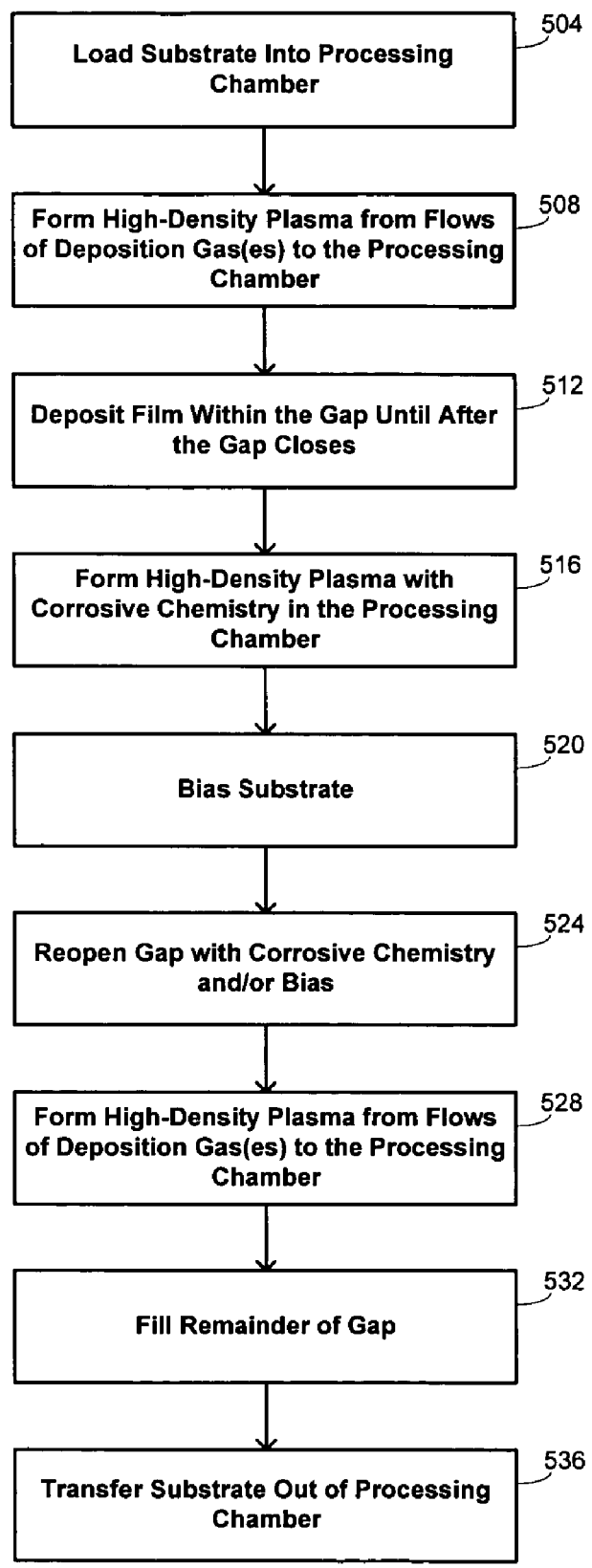
FIG. 5 is a flow diagram illustrating a method for depositing a film within a gap in an embodiment of the invention.

An overview of how gaps may be filled is provided with FIG. 5, which is a flow diagram that summarizes various embodiments of the invention. A substrate having a gap formed between adjacent raised surfaces is loaded into a processing chamber at block 504. In some embodiments, the substrate has a gap in an open area and a gap in a dense area, the gap in the open area having a width at least five times a width of a the gap in the dense area. While different gap geometries may be accommodated, in some embodiments the gap has a width less than less than 100 nm or less than 65 nm and has an aspect ratio greater than 5:1 or greater than 6:1.

The initial deposition is performed by forming a high-density plasma at block 508 from flows of deposition gases provided to the processing chamber. As discussed above, a silicon oxide layer may conveniently be deposited with deposition gases that comprise $SiH_4$, $O_2$, and a fluent gas, and perhaps also including a dopant gas where a doped layer is to be deposited. The film is deposited over the substrate and within the gap at block 512 at least until after the gap has closed, i.e. so that a deposition thickness $D_1$ of the layer is greater than the critical deposition thickness $D_c$ required to close the gap.

Subsequent to this initial deposition, a high-density plasma that has a chemistry corrosive to the deposited material is formed in the processing chamber at block 516.

A halogen-based chemistry is suitable for etching silicon oxide materials, and may be provide by a flow of a halogen-containing gas to the process chamber, such as by a fluorine-containing gas. Suitable fluorine-containing gases include $F_2$, $NF_3$, $CF_4$, $C_3F_8$, and the like. While this provides a chemical mechanism to etch back the deposited layer, the sputtering characteristics of the high-density plasma may also be used to provide a mechanical mechanism for etching back the deposited layer, particularly when the substrate is electrically biased as indicated at block 520. Application of such a bias is optional and is not used in several embodiments of the invention. The application of such a bias increases the sputtering effect by attracting the charged species of the plasma to the substrate nonisotropically. The application of such chemical and/or mechanical etching processes is thus used to reopen the gap at block 524, exposing any intermediate void that may have been formed within the deposited layer.

The subsequent deposition is performed in a manner similar to the initial deposition, by forming a high-density plasma at block 528 from flows of deposition gases to the processing chamber. Usually, the composition of the deposition gases will be similar for both deposition phases, but the specific deposition characteristics may differ by having different deposition/sputter ratios, reflecting the difference in shape of the gap during the different deposition phases. If two deposition phases are sufficient, the remainder of the gap may be filled at block 532, although other embodiments may cycle greater numbers of deposition and etching phases. Once the gap has been filled, the substrate is transferred out of the processing chamber at block 536.

Merely by way of example, one exemplary process for deposition of an undoped silicon oxide layer on a 300-mm-diameter silicon wafer deposits an initial layer with a high-density plasma formed from a 45-sccm $SiH_4$ flow, a 60-sccm $O_2$ flow, and a 1000-sccm $H_2$ flow. This initial deposition is performed under processing conditions that provide a deposition/sputter ratio of about 30. This deposition is performed until the deposited thickness $D_1$ is approximately 1.2 times the critical deposition thickness $D_c$. This is followed by etching the deposited material using a plasma formed from an 80-sccm $F_2$ flow and a 600-W bias applied to the substrate. A subsequent deposition uses a high-density plasma formed from gases having the same flow characteristics as the initial deposition but under processing conditions that provide a deposition/sputter ratio of about 10.

Figure 6A:
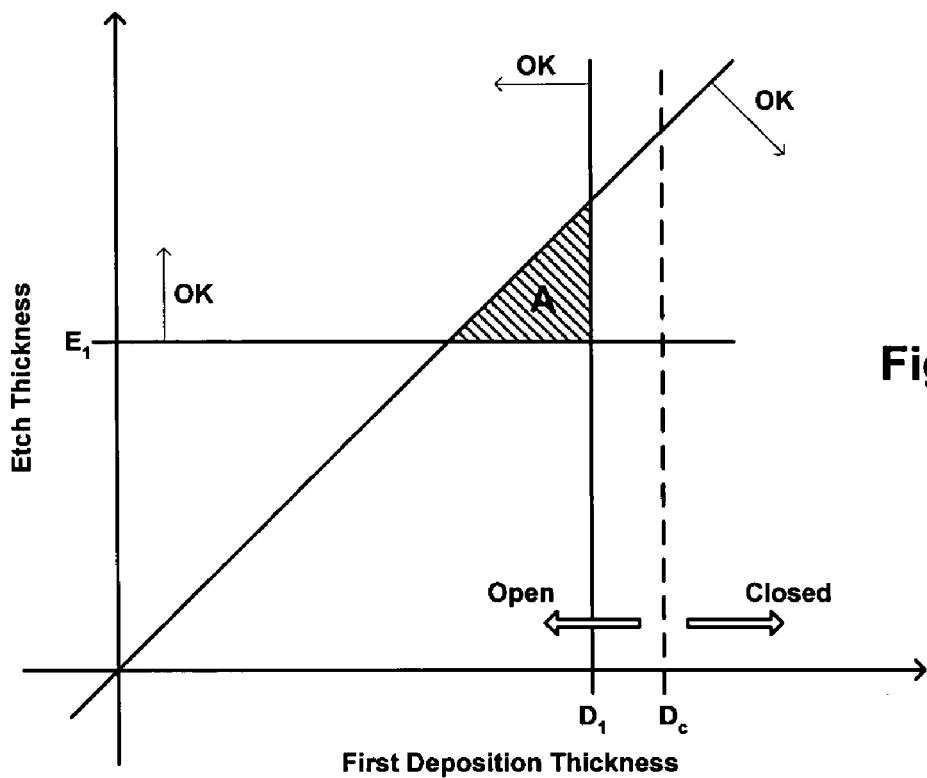
FIGS. 6A-6C provide graphical comparisons of dep/etch/dep process spaces under different conditions.
Figure 6B:
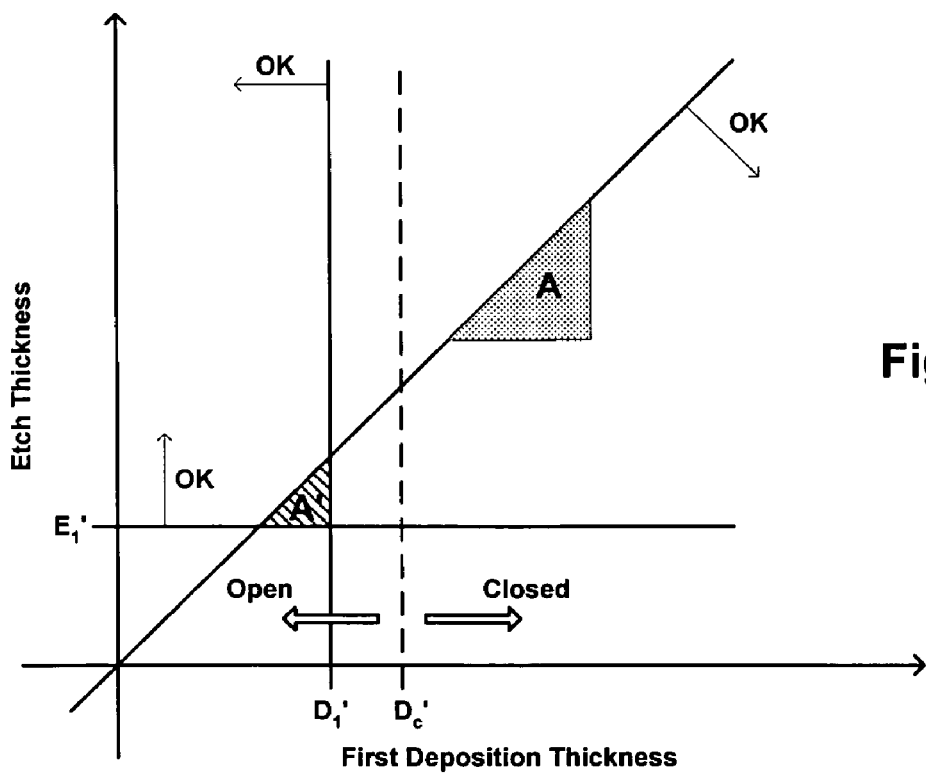
Figure 6C:
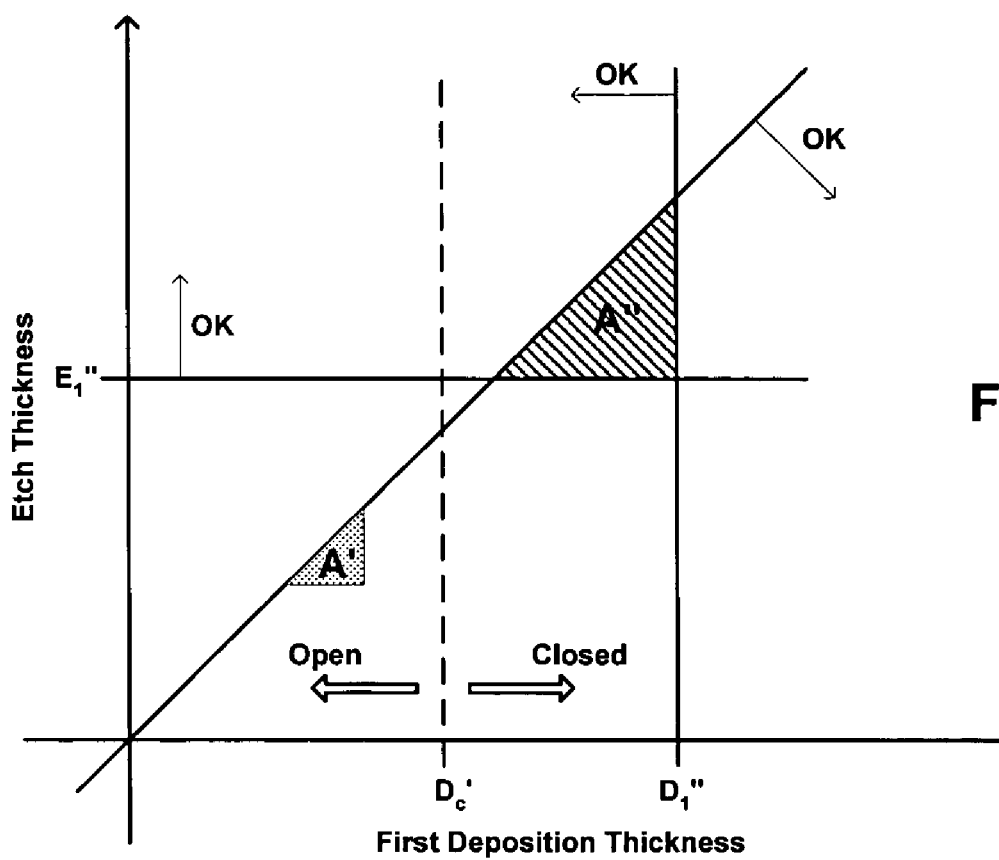

The process space that is exploited by embodiments of the invention may be understood with reference to FIGS. 6A-6C. The process space may be characterized by relationships among the deposition and etch thicknesses. For instance, a traditional dep/etch/dep process is illustrated in FIG. 6A with the process spaced defined by the intersection of three regions in the etch-thickness-deposition-thickness plane. First, a traditional deposition is performed to provide a deposition thickness $D_1 < D_c$, illustrated by the portion of the plane to the left of the vertical line at $D_1$. The drawing notes that the gap remains open for $D_1 < D_c$, but closes when $D_1 > D_c$. Second, the traditional etching is performed to remove an amount of material sufficient to reopen the gap a desired amount, illustrated by the portion of the plane above the horizontal line at $E_1$.

A third constraint may be understood as follows, and imposes the condition that the etch be less than the amount that would reduce the open-field coverage to zero. The open field coverage $T_{dep}^{(open)}$ is approximately proportion to the vertical deposition thickness D:

$$T_{dep}^{(open)} \cong R_{dep} D,$$

where $R_{dep\ is}$ a positive real-number constant of proportionality. The blanket film etch amount E and the open-field etch amount $T_{etch}^{(open)}$ are similarly approximately proportional:

$$T_{etch}^{(open)} \cong R_{etch} E,$$

where $R_{etch}$ is also a positive real-number constant of proportionality. The etching reduces the open-field coverage to zero when $T_{etch}^{(open)} = T_{dep}^{(open)}$, i.e. when $$E = \frac{R_{dep}}{R_{etch}} D.$$

In the graph, then, the constraint that the etch be less than the amount that would reduce the open-field coverage to zero is defined by that portion of the plane below the line having slope $R_{dep}/R_{etch}$.

The process space for a traditional dep/etch/dep process is thus the region A in FIG. 6A representing the intersection of the areas defined by these three constraints. Within such a traditional approach, an increase in the aspect ratio and/or a decrease in the width of the causes a decrease in the critical deposition thickness $D_c$. This results in a decrease in the initial deposition thickness $D_1$ with a corresponding decrease in the etch amount $E_1$: because less material is deposited, only a relatively thin amount is available to be etched back. This is illustrated in FIG. 6B, where new, lower critical deposition thickness is denoted $D_c'$ and the corresponding initial deposition and etching thickness are respectively denoted $D_1'$ and $E_1'$. The resulting process space A' is smaller, and continues to grow ever smaller as applications are developed required deposition in higher-aspect-ratio narrower gaps. Region A is shown with stippled shading in FIG. 6A for comparison with region A'.

FIG. 6C illustrates the effect on process space when the constraint $D_1 < D_c$ is relaxed in accordance with embodiments of the invention (see block 512 of FIG. 5). In this instance, the greater deposition thickness is denoted $D_1''$ and is greater than $D_c'$ (and therefore also greater than $D_1'$). This permits a greater thickness to be etched back, denoted $E_1'$. The resulting process space is denoted A'' and is larger than the process space A' reproduced for purposes of comparison in FIG. 6C. In some embodiments, process space A'' may define a region of processing conditions similar to or even larger than process space A, i.e. using processing conditions suitable for gaps having larger widths and/or smaller aspect ratios under a tradition approach.

3. Exemplary Substrate Processing System

Figure 7A:
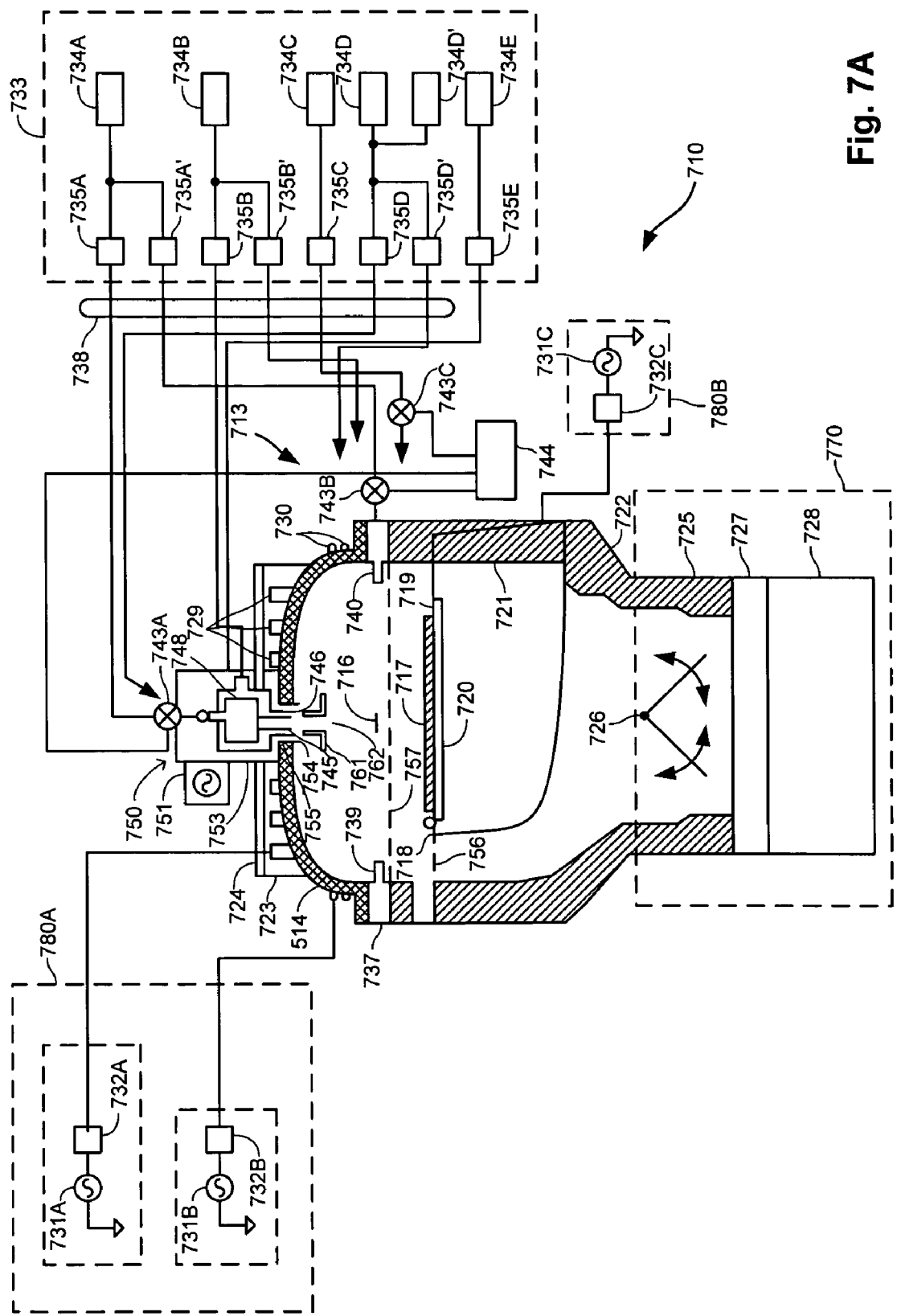
FIG. 7A is a simplified diagram of one embodiment of a high-density-plasma chemical-vapor-deposition system with which methods of the invention may be implemented.

The inventors have implemented embodiments of the invention with the ULTIMA™ system manufactured by APPLIED MATERIALS, INC., of Santa Clara, Calif., a general description of which is provided in commonly assigned U.S. Pat. No. 6,170,428, "SYMMETRIC TUNABLE INDUCTIVELY COUPLED HDP-CVD REACTOR," filed Jul. 15, 1996 by Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha, the entire disclosure of which is incorporated herein by reference. An overview of the system is provided in connection with FIGS. 7A and 7B below. FIG. 7A schematically illustrates the structure of such an HDP-CVD system 710 in one embodiment. The system 710 includes a chamber 713, a vacuum system 770, a source plasma system 780A, a bias plasma system 780B, a gas delivery system 733, and a remote plasma cleaning system 750.

The upper portion of chamber 713 includes a dome 714, which is made of a ceramic dielectric material, such as aluminum oxide or aluminum nitride. Dome 714 defines an upper boundary of a plasma processing region 716. Plasma processing region 716 is bounded on the bottom by the upper surface of a substrate 717 and a substrate support member 718.

A heater plate 723 and a cold plate 724 surmount, and are thermally coupled to, dome 714. Heater plate 723 and cold plate 724 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 713 includes a body member 722, which joins the chamber to the vacuum system. A base portion 721 of substrate support member 718 is mounted on, and forms a continuous inner surface with, body member 722. Substrates are transferred into and out of chamber 713 by a robot blade (not shown) through an insertion/removal opening (not shown) in the side of chamber 713. Lift pins (not shown) are raised and then lowered under the control of a motor (also not shown) to move the substrate from the robot blade at an upper loading position 757 to a lower processing position 756 in which the substrate is placed on a substrate receiving portion 719 of substrate support member 718. Substrate receiving portion 719 includes an electrostatic chuck 720 that secures the substrate to substrate support member 718 during substrate processing. In a preferred embodiment, substrate support member 718 is made from an aluminum oxide or aluminum ceramic material.

Vacuum system 770 includes throttle body 725, which houses twin-blade throttle valve 726 and is attached to gate valve 727 and turbo-molecular pump 728. It should be noted that throttle body 725 offers minimum obstruction to gas flow, and allows symmetric pumping. Gate valve 727 can isolate pump 728 from throttle body 725, and can also control chamber pressure by restricting the exhaust flow capacity when throttle valve 726 is fully open. The arrangement of the throttle valve, gate valve, and turbo-molecular pump allow accurate and stable control of chamber pressures up to about 1 millitorr to about 2 torr.

The source plasma system 780A includes a top coil 729 and side coil 730, mounted on dome 714. A symmetrical ground shield (not shown) reduces electrical coupling between the coils. Top coil 729 is powered by top source RF (SRF) generator 731A, whereas side coil 730 is powered by side SRF generator 731B, allowing independent power levels and frequencies of operation for each coil. This dual coil system allows control of the radial ion density in chamber 713, thereby improving plasma uniformity. Side coil 730 and top coil 729 are typically inductively driven, which does not require a complimentary electrode. In a specific embodiment, the top source RF generator 731A provides up to 2,500 watts of RF power at nominally 2 MHz and the side source RF generator 731B provides up to 5,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 780B includes a bias RF ("BRF") generator 731C and a bias matching network 732C. The bias plasma system 780B capacitively couples substrate portion 717 to body member 722, which act as complimentary electrodes. The bias plasma system 780B serves to enhance the transport of plasma species (e.g., ions) created by the source plasma system 780A to the surface of the substrate. In a specific embodiment, bias RF generator provides up to 10,000 watts of RF power at a frequency less than 5 MHz, as discussed further below.

RF generators 731A and 731B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 732A and 732B match the output impedance of generators 731A and 731B with their respective coils 729 and 730. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 7B:
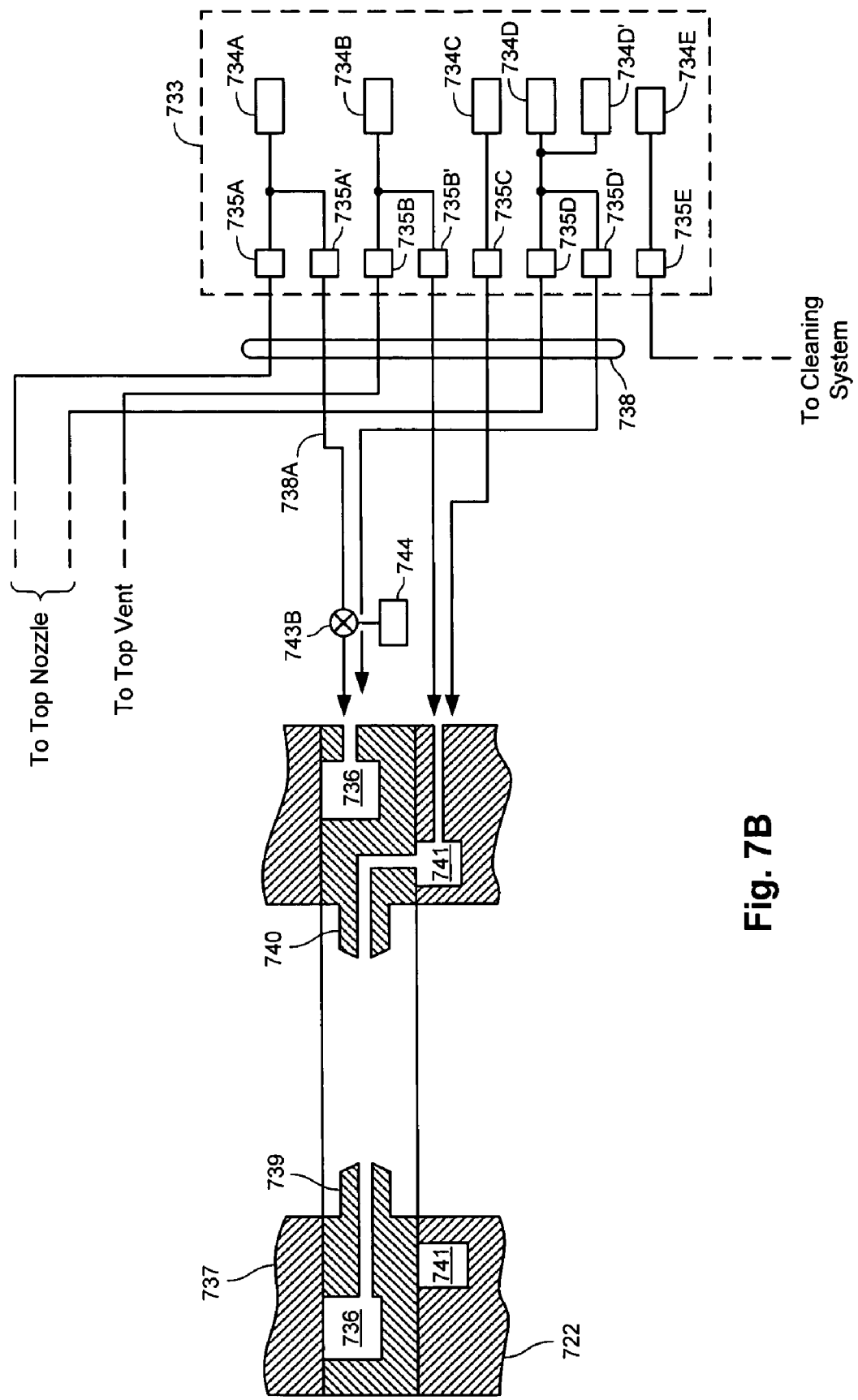
FIG. 7B is a simplified cross section of a gas ring that may be used in conjunction with the exemplary processing system of FIG. 7A.

A gas delivery system 733 provides gases from several sources, 734A-734E chamber for processing the substrate via gas delivery lines 738 (only some of which are shown). As would be understood by a person of skill in the art, the actual sources used for sources 734A-734E and the actual connection of delivery lines 738 to chamber 713 varies depending on the deposition and cleaning processes executed within chamber 713. Gases are introduced into chamber 713 through a gas ring 737 and/or a top nozzle 745. FIG. 7B is a simplified, partial cross-sectional view of chamber 713 showing additional details of gas ring 737.

In one embodiment, first and second gas sources, 734A and 734B, and first and second gas flow controllers, 735A' and 735B', provide gas to ring plenum 736 in gas ring 737 via gas delivery lines 738 (only some of which are shown). Gas ring 737 has a plurality of source gas nozzles 739 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 737 has 12 source gas nozzles made from an aluminum oxide ceramic.

Gas ring 737 also has a plurality of oxidizer gas nozzles 740 (only one of which is shown), which in a preferred embodiment are co-planar with and shorter than source gas nozzles 739, and in one embodiment receive gas from body plenum 741. In some embodiments it is desirable not to mix source gases and oxidizer gases before injecting the gases into chamber 713. In other embodiments, oxidizer gas and source gas may be mixed prior to injecting the gases into chamber 713 by providing apertures (not shown) between body plenum 741 and gas ring plenum 736. In one embodiment, third, fourth, and fifth gas sources, 734C, 734D, and 734D', and third and fourth gas flow controllers, 735C and 735D', provide gas to body plenum via gas delivery lines 738. Additional valves, such as 743B (other valves not shown), may shut off gas from the flow controllers to the chamber. In implementing certain embodiments of the invention, source 734A comprises a silane $SiH_4$ source, source 734B comprises a molecular oxygen $O_2$ source, source 734C comprises a silane $SiH_4$ source, source 734D comprises a helium He source, and source 734D' comprises a molecular hydrogen $H_2$ source.

In embodiments where flammable, toxic, or corrosive gases are used, it may be desirable to eliminate gas remaining in the gas delivery lines after a deposition. This may be accomplished using a 3-way valve, such as valve 743B, to isolate chamber 713 from delivery line 738A and to vent delivery line 738A to vacuum foreline 744, for example. As shown in FIG. 7A, other similar valves, such as 743A and 743C, may be incorporated on other gas delivery lines. Such three-way valves may be placed as close to chamber 713 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 7A, chamber 713 also has top nozzle 745 and top vent 746. Top nozzle 745 and top vent 746 allow independent control of top and side flows of the gases, which improves film uniformity and allows fine adjustment of the film's deposition and doping parameters. Top vent 746 is an annular opening around top nozzle 745. In one embodiment, first gas source 734A supplies source gas nozzles 739 and top nozzle 745. Source nozzle MFC 735A' controls the amount of gas delivered to source gas nozzles 739 and top nozzle MFC 735A controls the amount of gas delivered to top gas nozzle 745. Similarly, two MFCs 735B and 735B' may be used to control the flow of oxygen to both top vent 746 and oxidizer gas nozzles 740 from a single source of oxygen, such as source 734B. In some embodiments, oxygen is not supplied to the chamber from any side nozzles. The gases supplied to top nozzle 745 and top vent 746 may be kept separate prior to flowing the gases into chamber 713, or the gases may be mixed in top plenum 748 before they flow into chamber 713. Separate sources of the same gas may be used to supply various portions of the chamber.

A remote microwave-generated plasma cleaning system 750 is provided to periodically clean deposition residues from chamber components. The cleaning system includes a remote microwave generator 751 that creates a plasma from a cleaning gas source 734E (e.g., molecular fluorine, nitrogen trifluoride, other fluorocarbons or equivalents) in reactor cavity 753. The reactive species resulting from this plasma are conveyed to chamber 713 through cleaning gas feed port 754 via applicator tube 755. The materials used to contain the cleaning plasma (e.g., cavity 753 and applicator tube 755) must be resistant to attack by the plasma. The distance between reactor cavity 753 and feed port 754 should be kept as short as practical, since the concentration of desirable plasma species may decline with distance from reactor cavity 753. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 720, do not need to be covered with a dummy wafer or otherwise protected, as may be required with an in situ plasma cleaning process. In FIG. 7A, the plasma-cleaning system 750 is shown disposed above the chamber 713, although other positions may alternatively be used.

A baffle 761 may be provided proximate the top nozzle to direct flows of source gases supplied through the top nozzle into the chamber and to direct flows of remotely generated plasma. Source gases provided through top nozzle 745 are directed through a central passage 762 into the chamber, while remotely generated plasma species provided through the cleaning gas feed port 754 are directed to the sides of the chamber 713 by the baffle 761.

Those of ordinary skill in the art will realize that specific parameters can vary for different processing chambers and different processing conditions, without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method of depositing a film on a substrate disposed in a substrate processing chamber, the substrate having a gap formed between adjacent raised surfaces, the method comprising:

providing flows of first precursor deposition gases to the substrate processing chamber;

forming a first high-density plasma from the flows of first precursor deposition gases to deposit a first portion of the film over the substrate and within the gap with a first deposition process that has simultaneous deposition and sputtering components until after the gap has closed;

etching back a sufficient part of the first portion of the film to reopen the gap;

providing flows of second precursor deposition gases to the substrate processing chamber; and forming a second high-density plasma from the flows of second precursor deposition gases to deposit a second portion of the film over the substrate and within the reopened gap with a second deposition process that has simultaneous deposition and sputtering components.

2. The method recited in claim 1 wherein etching back the sufficient part of the first portion of the film comprises forming a third high-density plasma in the processing chamber from a flow of an etchant gas corrosive to the film.

3. The method recited in claim 2 wherein etching back the sufficient part of the first portion of the film further comprises applying an electrical bias to the substrate.

4. The method recited in claim 2 wherein:
the first and second precursor deposition gases each comprise a silicon-containing gas and an oxygen-containing gas, whereby the film comprises a silicon oxide film; and
the etchant gas comprises a halogen-containing gas.

5. The method recited in claim 4 wherein the halogen-containing gas comprises a fluorine-containing gas.

6. The method recited in claim 4 wherein at least one of the first and second precursor deposition gases further comprises a dopant-containing gas.

7. The method recited in claim 4 wherein at least one of the first and second precursor deposition gases comprises molecular hydrogen $H_2$.

8. The method recited in claim 7 wherein the molecular hydrogen $H_2$ is provided to the process chamber with a flow rate that exceeds 500 sccm.

9. The method recited in claim 1 wherein the first portion of the film is deposited over the substrate and within the gap with a thickness that exceeds a critical thickness for closing the gap by more than 5% of the critical thickness.

10. The method recited in claim 1 wherein the first portion of the film is deposited over the substrate and within the gap with a thickness that exceeds a critical thickness for closing the gap by more than 10% of the critical thickness.

11. The method recited in claim 1 wherein the gap comprises a plurality of gaps formed between adjacent raised surfaces, a first of the gaps having a width at least five times a width of a second of the gaps.

12. The method recited in claim 1 wherein the gap has an aspect ratio of at least 5:1 and a width less than 100 nm.

13. The method recited in claim 1 wherein the gap has an aspect ratio of at least 6:1 and a width less than 65 nm.

14. The method recited in claim 1 wherein the second portion of the film is deposited over the substrate and within the reopened gap until after the gap has closed again, the method further comprising:
etching back a sufficient part of the second portion of the film to reopen the gap again;
providing flows of third precursor deposition gases to the substrate processing chamber; and
forming a third high-density plasma from the flows of the third precursor deposition gases to deposit a third portion of the film over the substrate and within the reopened gap with a third deposition process that has simultaneous deposition and sputtering components.

15. A method of depositing a silicon oxide film on a substrate disposed in a substrate processing chamber, the substrate having a plurality of gaps distributed in open and dense areas over the substrate, at least one gap in the dense area having an aspect ratio greater than 5:1 and a width less than 100 nm, and at least one gap in the open area having a width at least five times the width of the at least one gap in the dense area, the method comprising:

providing first flows of $SiH_4$, $O_2$, and a first fluent gas to the substrate processing chamber;
forming a first high-density plasma from the first flows of $SiH_4$, $O_2$, and the first fluent gas to deposit a first portion of the silicon oxide film over the substrate and within the gaps with a first deposition process that has simultaneous deposition and sputtering components until after the at least one gap in the dense area has closed;
providing a first flow of a fluorine-containing gas to the substrate processing chamber;
forming a second high-density plasma from the first flow of the fluorine-containing gas to etch back a sufficient part of the first portion of the silicon oxide film to reopen the gap;
applying a bias to the substrate while the first portion of the silicon oxide film is being etched back;
providing second flows of $SiH_4$, $O_2$, and a second fluent gas to the substrate processing chamber; and
forming a third high-density plasma from the second flows of $SiH_4$, $O_2$, and the second fluent gas to deposit a second portion of the silicon oxide film over the substrate and within the reopened gap with a second deposition process that has simultaneous deposition and sputtering components.

16. The method recited in claim 15 wherein the first and second fluent gases each comprise molecular hydrogen $H_2$ provided to the substrate processing chamber at a flow rate that exceeds 500 sccm.

17. The method recited in claim 15 wherein the first portion of the silicon oxide film is deposited over the substrate and within the gap with a thickness that exceeds a critical thickness for closing the gap by more than 5% of the critical thickness.

18. The method recited in claim 15 wherein the first portion of the silicon oxide film is deposited over the substrate and within the gap with a thickness that exceeds a critical thickness for closing the gap by more than '0% of the critical thickness.

19. The method recited in claim 15 wherein the second portion of the silicon oxide film is deposited over the substrate and within the reopened gap until after the gap has closed again, the method further comprising:
providing a second flow of a fluorine-containing gas to the substrate processing chamber;
forming a fourth high-density plasma from the second flow of the fluorine-containing gas to etch back a sufficient part of the second portion of the silicon oxide film to reopen the gap again;
providing third flows of $SiH_4$, $O_2$, and a third fluent gas to the substrate processing chamber; and
forming a fifth high-density plasma from the third flows of $SiH_4$, $O_2$, and the third fluent gas to deposit a third portion of the silicon oxide film over the substrate and within the reopened gap with a third deposition process that has simultaneous deposition and sputtering components.

* * * * *